United States Patent [19]

Takagi et al.

[11] Patent Number: 4,577,154
[45] Date of Patent: Mar. 18, 1986

[54] PULSE WIDTH MODULATION CIRCUIT AND INTEGRATION CIRCUIT OF ANALOG PRODUCT USING SAID MODULATION CIRCUIT

[75] Inventors: Katsuaki Takagi, Hachioji; Yuzo Kita, Fuchu; Yoshimune Hagiwara; Kazuyoshi Ogawa, both of Kodaira; Hideo Hara, Tachikawa, all of Japan

[73] Assignees: Hitachi, Ltd.; Hitachi Micro Computer Engineering Ltd., both of Tokyo, Japan

[21] Appl. No.: 517,407

[22] Filed: Jul. 26, 1983

[30] Foreign Application Priority Data

Jul. 28, 1982 [JP] Japan .................. 57-130336

[51] Int. Cl.⁴ .................. H03K 5/05; H03K 7/08
[52] U.S. Cl. .................. 328/158; 307/498; 307/265; 328/160; 328/58
[58] Field of Search .............. 307/490, 498, 494, 491, 307/261, 265; 328/158, 160, 162, 163; 324/141, 142; 364/606, 841, 842, 843

[56] References Cited

U.S. PATENT DOCUMENTS 4,066,959 1/1978 Milkovic .................. 324/141
4,495,463 1/1985 Milkovic .................. 324/142

Primary Examiner—John Zazworsky
Attorney, Agent, or Firm—Antonelli, Terry & Wands

[57] ABSTRACT

A pulse width modulation circuit which can cancel the mean error of pulse width modulation with respect to time due to the offset voltage of a triangular wave signal and to the offset voltage of a comparator, by adding simple circuits to an existing pulse width modulation circuit. The invention relates also to an integration circuit of the product of two analog signals using the pulse width modulation circuit described above.

The principle of the present invention combines a circuit for cancelling the offset of a triangular wave signal by inverting either the triangular wave signal with respect to an input signal or the input signal with respect to the triangular wave signal, in every predetermined period, with a circuit for eliminating the offset of a comparator by inverting the output of the comparator and replacing the input terminals of the comparator if the input signal is not inverted, or connecting the input terminal of the comparator as such if the input signal is inverted.

15 Claims, 6 Drawing Figures

PULSE WIDTH MODULATION CIRCUIT AND INTEGRATION CIRCUIT OF ANALOG PRODUCT USING SAID MODULATION CIRCUIT

BACKGROUND OF THE INVENTION

This invention relates to a pulse width modulation circuit using a triangular wave generation circuit and to an integration circuit using the pulse width modulation circuit. More particularly, the present invention relates to an integration circuit which is particularly suitable for generating pulses in such a number as to be proportional to the integration of the product of two signals, and also to a pulse width modulation circuit using the former.

Figure 1:
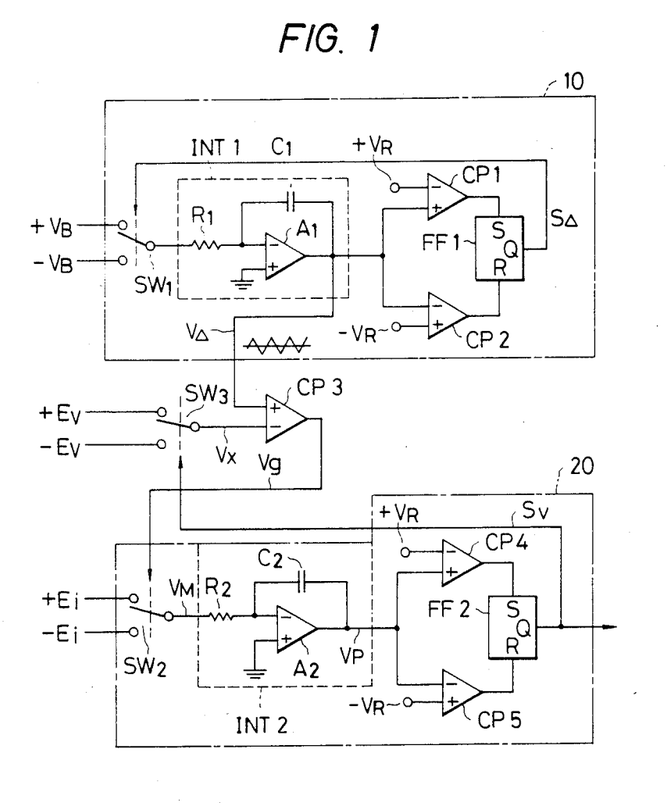
FIG. 1 is a circuit diagram showing the principal portion of a conventional circuit for an electronic appliance having a pulse width modulation circuit.

FIG. 1 illustrates a two-phase electronic type energy meter produced by modifying a three-phase electric energy meter disclosed on page 257 of INT. J. Electronics, 1980, Vol. 48, No. 3.

A triangular wave generation circuit 10 consists of an integrator INT1 which selectively receives d.c. voltages $V_B$ and $-V_B$ via a switch SW1, a flip-flop FF1 generating a signal SΔ which controls the switch SW1 and first and second comparators CP1 and CP2 which control set and reset operations of the flip-flop, respectively. The integrator INT1 consists of a resistor R1, a capacitance C1 and an amplifier A1. The comparators CP1 and CP2 compare the output of the amplifier A1 with the reference voltages $V_R$ and $-V_R$ and generate signals for setting and resetting the flip-flop FF1 when they are in agreement, respectively. The switch SW1 changes over the voltage to $V_B$ and $-V_B$ when the signal SΔ is 0 and 1, respectively, and applies the voltage to the integrator INT1. Thus, the output signal VΔ from the circuit 10 becomes a triangular wave having an inclination of $V_B/(R_1C_1)$ in both positive and negative portions and a peak of $\pm V_R$. This output signal VΔ is applied to the non-inversion input terminal of the comparator CP3, and a first a.c. signal $E_V$ or its inversion signal $-E_V$ is applied as an input voltage $V_x$ to the inversion input terminal of the comparator CP3. The switch SW3 selects the signals $-E_V$ and $E_V$ when the later-appearing signal $S_V$ is 1 and 0, respectively.

The output $V_g$ of the comparator CP3 becomes "1" and "0" when the level difference between the triangular wave VΔ and the input voltage $V_x$ is positive and negative, respectively. Thus, the output signal $V_g$ becomes a signal formed by modulating the pulse width of the input signal $V_x$.

Here, the degree of pulse modulation D is defined in the following manner:

$$D = a/(a+b) \quad (1)$$

where a is the time in which $V_g$ is "1" during one cycle of $V_g$ (that is, one cycle of the triangular wave VΔ), and b is the time in which $V_g$ is "0".

On the other hand, the comparator CP3 generates $V_g$="0" and $V_g$="1" when $V_x>$VΔ and when $V_x<$VΔ, respectively. Accordingly, the following equations are given with T representing one cycle of the triangular wave:

$$a = \tfrac{1}{2}(1-(V_x/V_R)T \quad (2)$$

$$a+b=T \quad (3)$$

Accordingly, the degree of pulse modulation D can be expressed as follows:

$$D = \tfrac{1}{2}(1-V_x/V_R) \quad (4)$$

Here, it is assumed that the frequency of the triangular wave is selected to be sufficiently higher than the frequency of the signal $S_v$ and that of the signal $E_v$.

The signal $V_g$ modulated in this manner controls the selector switch SW2 for the second a.c. current $E_i$ proportional to a current applied to an electric system and its inversion signal $-E_i$ so that the switch SW2 selects the signals $E_i$ and $-E_i$ when the signal $V_g$ is 1 and 0, respectively.

The mean value $\overline{V_M}$ of the output $V_M$ of the switch SW2 over one cycle of the triangular wave is given as fiollow:

$$V_M = E_i \times D + (-E_i) \times (1-D) = -(V_x E_i)/V_R \quad (5)$$

In other words;

$$\overline{V_M} = \begin{cases} -\dfrac{E_v E_i}{V_R} & \text{(when } S_v = 0\text{)} \quad (5\text{-}1) \\ +\dfrac{E_v E_i}{V_R} & \text{(when } S_v = 1\text{)} \quad (5\text{-}2) \end{cases}$$

Thus, the mean value of $V_M$ with respect to time is proportional to the product of the first input $V_x$ and the second input $E_i$.

The selection output $V_M$ of the switch SW2 is applied to the integrator INT2 inside the pulse generation circuit 20. The integrator INT2 consists of a resistor R2, a capacitance C2 and an amplifier A2, and produces an integration signal $V_P$ of the input $V_M$ from the output terminal of the amplifier A2. Comparators CP4 and CP5 compare the integration signal $V_p$ with the reference voltages $V_R$ and $-V_R$, respectively, and set and reset the flip-flop EF2 when they are in agreement, respectively.

Change-over of the signals $E_v$ and $-E_v$ by $S_v$ prevents the saturation of the integration signal $V_p$ by inverting the polarity of the input $V_M$ to the integrator INT2, and lets $V_p$ change repeatedly between the voltages $V_p$ and $-V_p$ at a frequency proportional to the integration value of the product of $E_v$ and $E_i$.

The integration value of the product of the voltage $E_v$ and the current $E_i$, that is, the electric power, can be measured by counting how many times the output $S_v$ of the flip-flop FF2 becomes 1.

Figure 2:
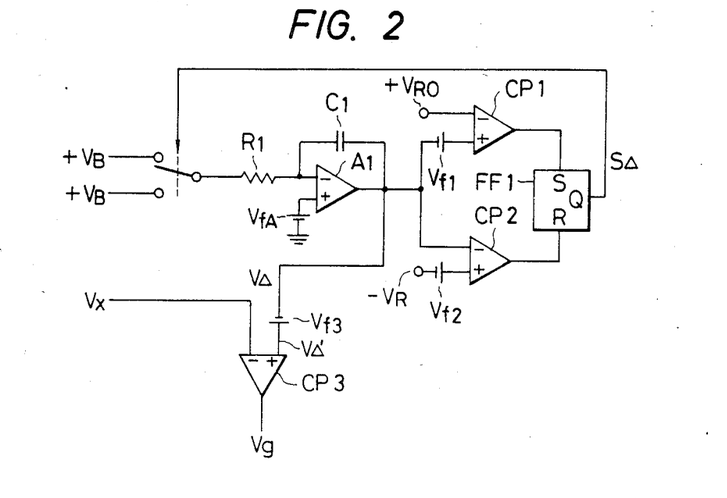
FIG. 2 is a circuit diagram showing an equivalent circuit of the pulse width modulation circuit of the circuit shown in FIG. 1 while the offset of the pulse width modulation circuit is taken into consideration.

It will be now considered that the amplifier $A_1$ and the comparators CP1 through CP3 have an offset. FIG. 2 is a circuit diagram showing the case in which these offset voltages are inserted as equivalent voltage sources. Here, the voltage sources $V_{fA}$, $V_{f1}-V_{f3}$ are those which equivalently express the offset quantities of the amplifier A1 and comparators CP1 through CP3, respectively. Accordingly, the amplifier A1 and the comparators CP1-CP3 in FIG. 2 can be regarded as having no offset. The triangular wave VΔ in this case has a waveform expressed by the following relation:

$$\text{inclination of rising waveform} = \frac{V_B + V_{fA}}{C_1 R_1}$$

-continued $$\text{inclination of falling waveform} = \frac{V_B - V_{fA}}{C_1 R_1}$$

turn-back voltage on positive side $= V_R - V_{f1}$ turn-back voltage on negative side $= -(V_R - V_{f2})$ As can be understood clearly from above, the mean voltage of this triangular wave $V\Delta$ becomes $\frac{1}{2}(V_{f2} - V_{f1})$ and is not zero when the offset $V_{f1}$ is not equal to the offset $V_{f2}$. Hereinafter, this mean voltage will be referred to as the "offset of the triangular wave". In this example, this offset results from the difference of the offset between the comparators CP1 and CP2.

Figure 3:
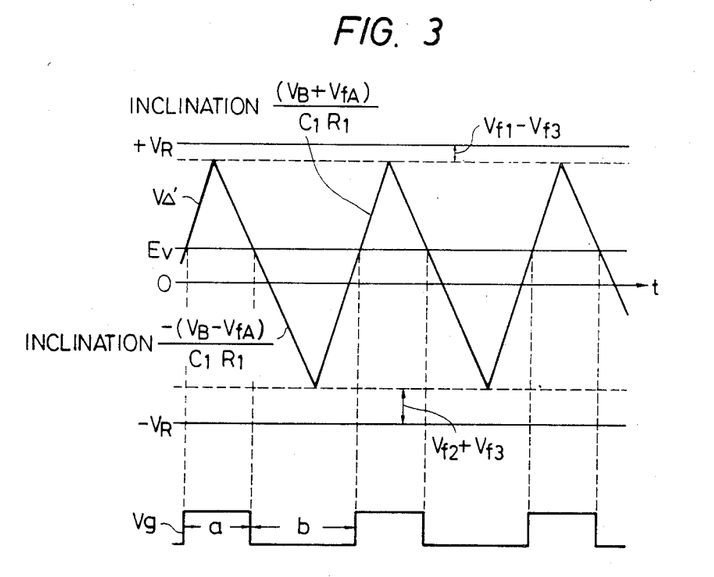
FIG. 3 is a diagram showing the time chart of the signal of the equivalent circuit shown in FIG. 3.

Because the offset voltage $V_{f3}$ of the comparator CP3 exists, this triangular wave voltage $V\Delta$ appears as if it were shifted to a voltage $V\Delta'$. The waveform of this voltage $V\Delta'$ has a value which is the sum of $V_{f3}$ to the positive and negative turn-back voltages of the waveform of $V\Delta$, respectively. The sum is more clearly illustrated in FIG. 3. In the same way as the formulas (1) through (3), the degree of pulse width modulation D of the modulation signal $V_g$ is given by the following formula:

$$D = \frac{1}{2}\left\{1 + \frac{V_x - \{\frac{1}{2}(V_{f2} - V_{f1}) + V_{f3}\}}{V_R - \frac{1}{2}(V_{f1} + V_{f2})}\right\} \quad (6)$$

In the formula (6) above, the denominator of the second item is equivalent to the change of the reference voltage $V_R$ because of the existence of the offset voltages of the comparators CP1 and CP2. The influence resulting from the change of $V_R$ can be compensated for by another means such as trimming of the $V_R$ generator; hence, the influence is not hereby dealt with.

If the following relation is given in the formula (6), $$V_R' = V_R - \frac{1}{2}(V_{f1} + V_{f2})$$

$$V_f = -\frac{1}{2}(V_{f2} - V_{f1}) - V_{f3}$$

then, D is given as follows:

$$D = \frac{1}{2}\left(1 + \frac{E_x - V_f}{V_R'}\right) \quad (7)$$

$V_f$ is the sum of the offset of the triangular wave and the offset of the comparator CP3 but with a different polarity. Accordingly, this is referred to as an "overall offset". If such an overall offset voltage exists, the mean value $\overline{V_M}$ of $V_M$ in one cycle of the triangular wave, that corresponds to the formula (5), is given by the following formula:

$$\overline{V_M} = \frac{1}{V_R'} \times (V_x + V_f) \times E_i \quad (8)$$

Accordingly, the frequency $f_o$ of the pulse $S_v$ becomes $f_o \propto (V_x + V_f) \times E_i$, and the overall offset voltage $V_f$ occurs as an error. This error depends upon the product of the overall offset $V_f$ and $E_i$ and hence, it is almost impossible to compensate for the error after detection of the pulse $S_v$. It is therefore necessary to cancel in advance the overall offset inside the pulse width modulation circuit.

Thus, it has been necessary conventionally either to select the comparators CP1 through CP3 having offset voltages which are as small as possible, or to add an offset adjusting circuit. This results eventually in the increase of the cost of production of the circuit.

SUMMARY OF THE INVENTION

It is therefore an object of the present invention to provide a pulse width modulation circuit which can cancel the mean error, with respect to time, of the degree of pulse width modulation due to the offset voltages of the triangular wave and comparators, by adding a simple circuit of a pulse width modulation circuit.

It is another object of the present invention to provide an integration circuit of the product of two analog signals, which circuit makes use of the pulse width modulation circuit described above.

To accomplish the objects described above, the present invention combines in principle means for cancelling the offset of a triangular wave by inverting either a triangular wave signal with respect to an input signal or the input signal with respect to the triangular wave signal every predetermined period, with means for eliminating the offset of comparators by inverting the output of the comparator, for replacing the input terminals of the comparators if the input signal is not inverted, and if the input signal is inverted, for connecting the input terminals of the comparator as such.

A pulse width modulation circuit is constituted which comprises means for inverting the input signal and applying it to the same terminal of a comparator and means for inverting the output of the comparator, or a pulse width modulation circuit is constituted which comprises means for inverting a triangular wave signal and connecting the triangular wave signal and the input signal in an opposite manner to the inputs of the comparator and means for inverting the output of the comparator. Thus, a pulse width modulation circuit is provided which can simultaneously eliminate both of the offset of the triangular wave and the offset of the comparator.

DESCRIPTION OF THE PREFERRED EMBODIMENTS

Figure 4:
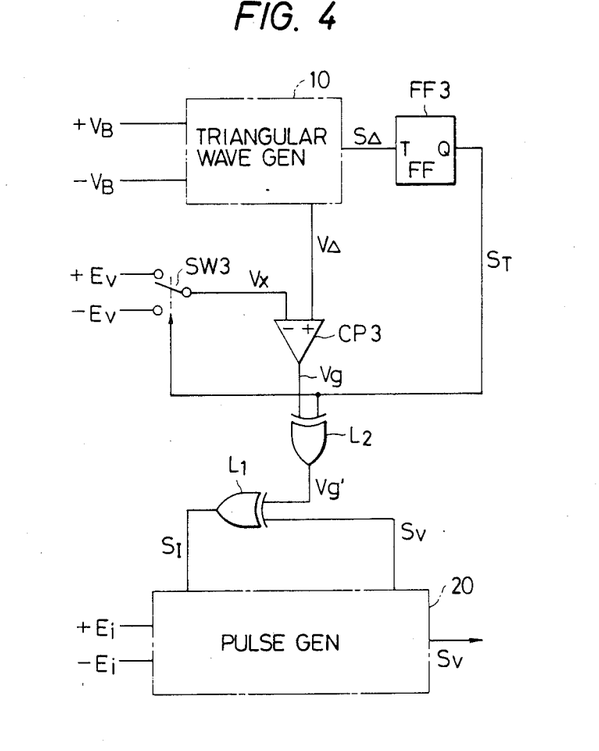
FIG. 4 is a block diagram showing a first embodiment of an integration circuit for an analog product using the pulse width modulation circuit of the present invention.

In FIG. 4, like reference numerals and symbols are used to identify like constituents as in FIG. 1. In FIG. 4 there are added an exclusive-OR gate (EOR gate) L2 for inverting the output $V_g$ of the comparator CP3, a toggle type flip-flop FF3 whose state is inverted by a pulse $S\Delta$, generated once a period of the triangular wave, and hence, producing a pulse formed by halving the frequency of $S\Delta$, and an EOR gate L1 for inverting the output $V_g'$ of the EOR gate L2.

The flip-flop FF3 generates a signal which controls the switch SW3 and the EOR gate L2 in a predetermined period, and $+E_\nu$ or $-E_\nu$ is selected by the switch SW3 in accordance with $S_T=1$ or $S_T=0$.

The EOR gate L2 is disposed in order to eliminate the mean error, with respect to time, of the degree of pulse width modulation, as will be described elsewhere. It inverts the signal $V_g'$ when the signal $S\Delta$ is 1. The EOR gate L1 inverts the output $V_g'$ of the EOR gate L2 when the output pulse $S_\nu$ of the pulse generator 20 is 1, and the output $S_I$ of this EOR gate L1 is applied in place of the signal $V_g$ of FIG. 1 to the switch SW2 (shown in FIG. 1) inside the pulse generation circuit 20.

The duty of the width modulated pulse $V_g$ generated from the comparator CP3 can be determined on the basis of a triangular wave $V\Delta'$ oscillating between two reference voltages $V_R'$ and $-V_R'$ that are obtained by gathering all the offset of the comparators CP1 through CP3, as explained in conjunction with the formula (7) and also on the basis of an equivalent input voltage $V_x'$ which is formed by adding the input voltage $E_x$ to the inversion input terminal of the comparator CP3 and the overall offset voltage $V_f$. Here, the following equation is given:

$$V_x' = V_x + V_f \quad (9)$$

Figure 5:
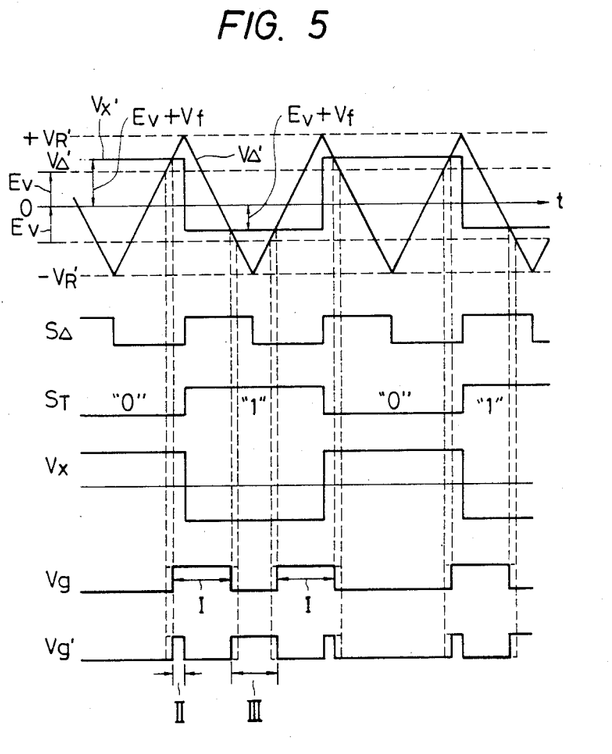
FIG. 5 is a diagram showing the time chart of the signal of the integration circuit shown in FIG. 5.

In other words, the triangular wave $V\Delta'$ and the equivalent input voltage $V_x'$ can be regarded as being compared with each other by an ideal comparator CP3 devoid of the offset. FIG. 5 is a timing chart showing the relation between various signals and the triangular wave $V\Delta'$. The signal $S$ changes from 0 to 1 or from 1 to 0 whenever the signal $V\Delta'$ coincides with either of $\pm V_R'$. Since the signal $S_T$ is formed by halving the frequency of the signal $S\Delta$, it changes from 0 to 1 or from 1 to 0 whenever the signal $V\Delta'$ coincides with either one of $\pm V_R'$. FIG. 5 shows the case in which the level of the signal $S_T$ changes whenever the signal $V\Delta'$ coincides with $V_R'$. On the other hand, the input voltage $V_x$ becomes $E_V$ and $-E_V$ whenever the signal $S_T$ becomes 0 and 1, respectively. FIG. 5 shows the case in which $V_f > 0$ for the signal $V_x'$.

Among the signals $V_g$ and $V_g'$, the solid line represents the pulses whose width is modulated and which are produced from the comparator CP3 and from the EOR gate L2 with respect to the signal $V_x'$, respectively.

In other words, the signal $V_g$ becomes 1 during the first period I in which the signal $V\Delta'$ exceeds the signal $V_x'$ and the signal $V\Delta'$ then becomes equal to the signal $V_x'$. On the other hand, the signal $V_g'$ becomes 1 during the second period II in which the signal $V_g$ is 1 and the signal $S_T$ is 0, or during the third period III in which the signal $V_g$ is 0 and the signal $S_T$ is 1. As can be seen from the diagram, the signals $V_g$ and $V_g'$ becomes pulses having the waveforms represented by broken lines when $V_f=0$.

When $V_f > 0$, therefore, the pulse width of the signal $V_g'$ becomes wide at the portion where $S_T=$"1" (period III) and becomes narrow at the portion where $S_T=0$ (period II). When one period of $S_T$ or the two periods of the triangular wave are considered, therefore, the influence of the overall voltage upon the degree of pulse width modulation can be seen offset.

The above is expressed by the formula. The degree of pulse width modulation $D_1$ of the pulse $V_g'$ with respect to the period in which $V_g'=$"1" when $S_T=1$ can be given as follows, because $V_x=-E_V$:

$$D_1 = \tfrac{1}{2}\left(1 + \frac{V_x + V_f}{V_R'}\right) \quad (10)$$

$$= \tfrac{1}{2}\left(1 - \frac{E_\nu - V_f}{V_R'}\right)$$

The degree of pulse width modulation $D_2$ of the pulse $V_g'$ with respect to $V_g'=1$ when $S_T=0$ can be given as follows, because $V_x=+E_\nu$:

$$D_2 = 1 - \tfrac{1}{2}\left(+\frac{E_\nu + V_f}{V_R'}\right) \quad (11)$$

$$= \tfrac{1}{2}\left(1 - \frac{E_\nu + V_f}{V_R'}\right)$$

Accordingly, the mean degree of pulse width modulation $\overline{D}$ in one cycle of $S_T$ or the two cycles of the triangular wave is given as follows:

$$\overline{D} = \tfrac{1}{2}(D_1 + D_2) \quad (12)$$

$$= \tfrac{1}{2}\left(1 - \frac{E_\nu}{V_R'}\right)$$

Thus, the influence of all the offset voltages contained in the triangular wave $V\Delta$ and in the comparator CP3 upon the mean degree of pulse width modulation can be cancelled by using the two cycle units of the triangular wave as the measuring unit.

When $S_V=0$, the output $S_I$ of the EOR gate L1 is equal to the signal $V_g'$. In this case, the mean value $V_M$ of the output $V_M$ of the switch SW2 (shown in FIG. 1) inside the pulse generation circuit 20 over the two cycles of the triangular wave becomes equal to the formula (5-1). When $S_V=1$, the signal $S_L$ is equal to $-V_g'$. Hence, the mean value $V_M$ over the two cycles becomes equal to the formula (5-2).

As has been described already with reference to FIG. 1, the output $S_V$ of the flip-flop FF2 is inverted whenever the signal $V_p$ obtained by integrating this $V_M$ becomes equal to either one of $\pm V_R$ in the same way as in the case shown in FIG. 1. Accordingly, the frequency of the pulse $S_V$ is proportional to the integrated value of the product of the signals $E_V$ and $E_i$. Thus, a pulse having a frequency proportional to the power can be obtained on the basis of the signal $V_M$.

In FIG. 4, the inversion signal $S_T$ is produced by halving the frequency of the output $S\Delta$ of the triangular wave generation circuit. This is the most simple and reliable method. A method which increases the frequency division ratio by some multiples and a method which divides the frequency on the non-multiple basis can be used, in principle, but these methods are not much advantageous because the time required for each cancelling becomes long. If cancelling is effected in a period shorter than the period of the triangular wave, a problem will occur that the cancelling effect drops. However, this method may be employed depending upon the intended application.

Figure 6:
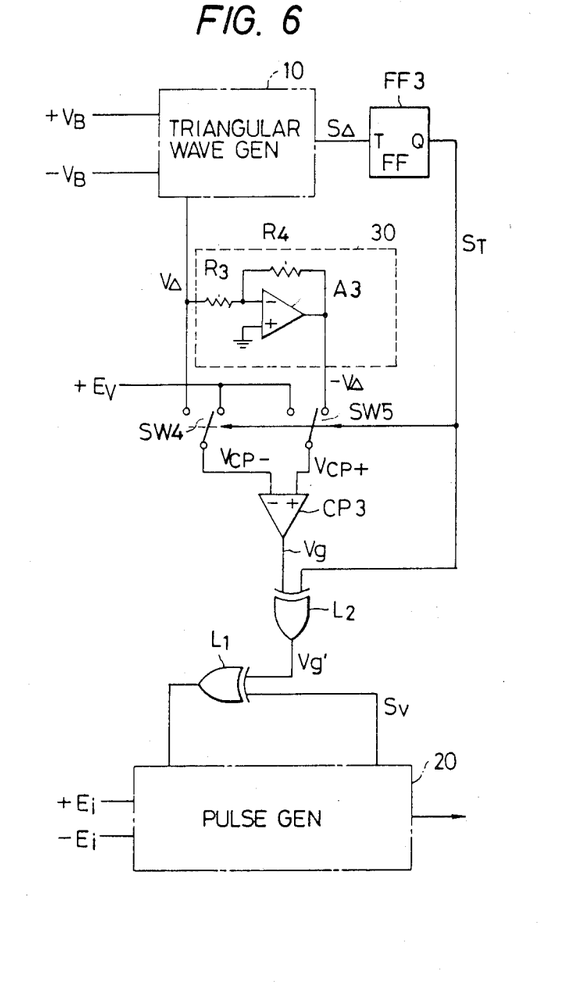
FIG. 6 is a second embodiment of the integration circuit for the analog product using the pulse width modulation circuit of the present invention.

FIG. 6 shows the second embodiment of the present invention, in which like reference numerals are used to identify like constituents as in FIG. 4. This embodiment includes further a circuit 30 for generating a triangular wave signal $-V\Delta$ which has the opposite polarity to the triangular wave signal $V\Delta$ by use of resistors R3 and R4 having the same value and an operational amplifier A3, and switches SW4 and SW5 for changing over $+E_v$ and $\pm V$ by the output $S_T$ of the flip-flop FF3 and connecting them to the comparator CP3. The rest are the same as those of the circuit shown in FIG. 4.

When $S_T=0$, for example, the switches SW4 and SW5 connect $+E_v$ to the inversion input terminal of the comparator CP3 and $-V\Delta$ to its non-inversion input terminal $V_{cp+}$, as shown in FIG. 6. When $S_T=1$, they connect $-V\Delta$ to the inversion input terminal $V_{cp-}$ and $E_v$ to the non-inversion input terminal $V_{cp+}$. In the circuit 30 for producing $-V\Delta$, the resistors R3 and R4 must be equal substantially accurately. The offset voltage of the operational amplifier A3 must be extremely small.

The reason why the offset of the triangular wave or that of the comparator CP3 can be cancelled in this circuit is the same as in the first embodiment. Assume the offset voltage of the comparator CP3 as $V_{f3}$ and the offset voltage of the triangular was signal $V\Delta$ as $V_{f\Delta}$ in the same way as in FIG. 2. Then, in the cycle of $S_T=1$ as viewed from the output $V_g'$ of the EOR gate L2, $+E_v$ is applied to the non-inversion input terminal of the CP3 and $V\Delta$ (with the proviso that the offset voltage $V_f$ is added) is applied to its inversion input terminal. In consideration of the offset voltage, $V_g'=0$ is produced when $E_v-V\Delta-V_{f\Delta}-V_{f3}$ is positive and $V_g'=1$ is produced when the latter is negative. Accordingly, the degree of pulse width modulation $D_1$ of $V_g'$ with respect to the time in which $V_g'=1$ is given as follows:

$$D_1 = \tfrac{1}{2}\left(1 - \frac{E_v - V_{f\Delta} - V_{f3}}{V_R'}\right) \quad (13)$$

In the cycle of $S_T=0$, $-V\Delta$ (with the proviso that the offset voltage $-V_{f\Delta}$ is added) is applied to the non-inversion terminal of the comparator CP3 and $+E_v$, to the inversion input terminal. Hence, the output of $V_g'$ becomes 0 when $E_v+V\Delta+V_{f\Delta}+V_{f3}$ is positive and 1 when it is negative. Accordingly, the degree of pulse width modulation $D_2$ with respect to time in which $V_g'=1$ is given as follows:

$$D_2 = \tfrac{1}{2}\left(1 - \frac{E_v + V_{f\Delta} + V_{f3}}{V_R'}\right) \quad (14)$$

Accordingly, the mean degree of pulse width modulation $\overline{D}$ when $S_T=0$ and when $S_T=1$ is given as follows:

$$\overline{D} = \tfrac{1}{2}(D_1 + D_2) \quad (15)$$

$$= \tfrac{1}{2}\left(1 - \frac{E_v}{V_R'}\right)$$

Thus, the error due to the offset voltages can be eliminated.

As described above, the present invention can realize a voltage-frequency convertor which provides a mean degree of pulse width modulation with respect to time, which is devoid of the influence of the triangular wave or comparator, with a high level of accuracy.

What is claimed is:

1. A pulse width modulation circuit comprising:
signal generation means for generating a triangular wave signal having a predetermined frequency;
clock signal generation means connected to receive the output of said signal generation means for generating a clock signal taking alternately first and second values in a predetermined period in synchronism with said triangular wave signal;
switch means for providing an output signal changing over between an analog signal to be used for pulse width modulation and a signal which is the inverted form of said analog signal in response to said clock signal;
comparison means for comparing said triangular wave signal and the output signals of said switch means to generate a binary output signal; and
inversion means for selectively inverting the output of said comparison means in response to said clock signal.

2. The pulse width modulation circuit as defined in claim 1 wherein said clock signal generation means includes means for dividing the frequency of said triangular wave signal by two.

3. The pulse width modulation circuit as defined in claim 1 wherein said inversion means is an exclusive-OR circuit to which the output of said comparison means and said clock signal are applied.

4. A pulse width modulation circuit comprising:
signal generation means for generating a triangular wave signal having a predetermined frequency and an inversion triangular wave signal which is inverted in polarity with respect to said triangular wave signal and has the same predetermined frequency;
clock signal generation means connected to said signal generation means for generating a clock signal taking alternately first and second values in a predetermined period in synchronism with said triangular wave signal;
comparison means for comparing two input signals and producing a binary output signal;
switch means for applying said triangular wave signal and an analog signal to be used for pulse width modulation to first and second input terminals of said comparison means, respectively, in response to the first value of said clock signal, and for applying said analog signal and said inversion triangular wave signal to the first and second input terminals of said comparison means, respectively, in response to the second value of said clock signal; and
inversion means for selectively inverting the output of said comparison means in response to said clock signal.

5. The pulse width modulation circuit as defined in claim 4 wherein said clock signal generation means includes means for dividing the frequency of said triangular wave signal by two.

6. The pulse width modulation circuit as defined in claim 4 wherein said inversion means is an exclusive-OR circuit to which the output of said comparison means and said clock signal are applied.

7. An analog product forming integration circuit comprising:
  signal generation means for generating a triangular wave signal having a predetermined frequency;
  clock signal generation means connected to receive the output of said signal generation means for generating a clock signal taking alternately first and second values in a predetermined period in synchronism with said triangular wave signal;
  first switch means for providing an output signal changing over between a first analog signal to be used for pulse width modulation and a signal which is the inverted form of said first analog signal in response to said clock signal;
  comparison means for comparing said triangular wave signal and the output signal of said first switch means to produce a binary output signal;
  first inversion means for inverting the output of said comparison means selectively in response to said clock signal;
  second inversion means for selectively inverting the output of said first inversion means in response to a control signal;
  second switching means for producing an output signal changing over between a second analog signal and a signal which is the inverted form of said second analog signal in response to the output of said second inversion means;
  integration means for integrating the output of said second switching means; and
  pulse generation means connected to said integration means for generating a pulse representing said control signal whenever the output of said integration means reaches a predetermined value.

8. The integration circuit as defined in claim 7 wherein said pulse generation means includes first means for comparing the output of said integration means with first and second reference values and second means for controlling said second inversion means so that said second inversion means alternately effects inversion and non-inversion of the output of said first inversion means in synchronism with detection of coincidence between the output of said integration means and the first or second reference value by said first means.

9. The integration circuit as defined in claim 8 wherein said second means consists of flip-flop means set alternately to first and second states whenever coincidence is detected by said first means, and said second inversion means consists of an exclusive-OR gate to which the output of said first inversion means and the output of said flip-flop means are applied.

10. The pulse width modulation circuit as defined in claim 7 wherein said clock signal generation means includes means for dividing the frequency of said triangular wave signal by two.

11. An analog product forming integration circuit comprising:
  signal generation means for generating a triangular wave signal having a predetermined frequency and an inversion triangular wave signal which is inverted in polarity with respect to said triangular wave signal and has the same predetermined frequency;
  clock signal generation means connected to said signal generation means for generating a clock signal taking alternately first and two values in every predetermined period in synchronism with said triangular wave signal;
  comparison means for comparing two input signals to produce a binary output signal;
  first switch means for applying said triangular wave signal and an analog signal to be used for pulse width modulation to first and second input terminals of said comparison means in response to the first value of said clock signal and for applying said analog signal and said inversion triangular wave signal to the first and second input terminals of said comparison means, respectively, in response to the second value of said clock signal;
  first inversion means for selectively inverting the output of said comparison means in response to said clock signal;
  second inversion means for selectively inverting the output of said first inversion means in response to a control signal;
  second switching means for producing an output signal changing over between a second analog signal and a signal which is the inverted form of said second analog signal in response to the output of said second inversion means;
  integration means for integrating the output of said second switching means; and
  pulse generation means connected to said integration means for generating a pulse representing said control signal whenever the output of said integration means reaches a predetermined value.

12. The integration circuit as defined in claim 11 wherein said pulse generation means includes first means for comparing the output of said integration means with first and second reference values and second means for controlling said second inversion means so that said second inversion means alternately effects inversion and non-inversion of the output of said first inversion means in synchronism with detection of coincidence between the output of said integration means and the first or second reference value by said first means.

13. The integration circuit as defined in claim 12 wherein said second means consists of flip-flop means set alternately to first and second states whenever said first means detects coincidence, and said second inversion means consists of an exclusive-OR gate to which the output of said first inversion means and the output of said flip-flop means are applied.

14. The pulse width modulation circuit as defined in claim 11 wherein said clock signal generation means includes means for dividing the frequency of said triangular wave signal by two.

15. The pulse width modulation circuit as defined in claim 11 wherein said second inversion means consists of an exclusive-OR circuit to which the output of said comparison means and said clock signal are applied.

* * * * *